(12) United States Patent
Yao et al.

(10) Patent No.: US 10,037,987 B2
(45) Date of Patent: Jul. 31, 2018

(54) SEMICONDUCTOR STRUCTURE OF ESD PROTECTION DEVICE AND METHOD FOR MANUFACTURING THE SAME

(71) Applicant: Silergy Semiconductor Technology (Hangzhou) Ltd., Hangzhou (CN)

(72) Inventors: Fei Yao, Hangzhou (CN); Shijun Wang, Hangzhou (CN); Dengping Yin, Hangzhou (CN)

(73) Assignee: SILERGY SEMICONDUCTOR TECHNOLOGY (HANGZHOU) LTD., Hangzhou (CN)

( * ) Notice: Subject to any disclaimer, the term of this patent is extended or adjusted under 35 U.S.C. 154(b) by 0 days.

(21) Appl. No.: 15/670,497

(22) Filed: Aug. 7, 2017

(65) Prior Publication Data
US 2018/0047718 A1    Feb. 15, 2018

(30) Foreign Application Priority Data
Aug. 11, 2016    (CN) .......................... 2016 1 0658085

(51) Int. Cl.
*H01L 27/02* (2006.01)
*H01L 23/60* (2006.01)
*H01L 29/866* (2006.01)
*H01L 21/77* (2017.01)

(52) U.S. Cl.
CPC .......... *H01L 27/0255* (2013.01); *H01L 21/77* (2013.01); *H01L 23/60* (2013.01); *H01L 27/0259* (2013.01); *H01L 29/866* (2013.01)

(58) Field of Classification Search
CPC ............. H01L 27/0255; H01L 27/0259; H01L 27/0262; H01L 29/866
See application file for complete search history.

(56) References Cited

U.S. PATENT DOCUMENTS

2015/0364460 A1* 12/2015 Huang ................ H01L 27/0255
257/106

FOREIGN PATENT DOCUMENTS

| CN | 106057781 A | 10/2016 |
| CN | 106229314 A | 12/2016 |

* cited by examiner

*Primary Examiner* — Daniel Shook
(74) *Attorney, Agent, or Firm* — Westman, Champlin & Koehler, P.A.

(57) ABSTRACT

Disclosed are a semiconductor structure of an ESD protection device with low capacitance and a method for manufacturing the same. The method for manufacturing a semiconductor structure of an ESD protection device, comprising: forming a buried layer with a first doping type and a buried layer with a second doping type in a first region and a second region at a top surface of a semiconductor substrate with a first doping type, respectively; forming an epitaxial layer with a second doping type on the buried layer with the first doping type and the buried layer with the second doping type, wherein the buried layer with the first doping type and the buried layer with the second doping type are buried between the semiconductor substrate and the epitaxial layer, a first doped region with a first doping type is formed at a top of a third region on the buried layer with the second doping type located on the epitaxial layer.

26 Claims, 5 Drawing Sheets

SEMICONDUCTOR STRUCTURE OF ESD PROTECTION DEVICE AND METHOD FOR MANUFACTURING THE SAME

CROSS-REFERENCE TO RELATED APPLICATION

This application claims the benefit of Chinese Patent Application No. 201610658085.1, filed on Aug. 11, 2016, which is incorporated herein by reference in its entirety.

BACKGROUND OF THE DISCLOSURE

Field of the Disclosure

The present disclosure relates to semiconductor technology, and more particularly, to a semiconductor structure of an ESD protection device and a method for manufacturing the same.

Background of the Disclosure

High-speed data transfer interfaces have high requirements on ESD (Electro-Static discharge) protection devices, which require ESD protection devices to have both of high ESD protection performance and low parasitic capacitance (generally required to be less than 0.5 pF), and this creates great challenges for designers.

Transient voltage suppressor (referred to as TVS) diodes are new products developed on the basis of the process of voltage regulator tubes, and have a circuit symbol the same as that of normal Zener diodes and an outer shape not different from that of common diodes. When two ends of a TVS diode is subjected to instantaneous high energy, the TVS diode can abruptly reduce its impendence at a very high speed (the speed can reach a maximum value at $1*10^{-12}$ s) and meanwhile absorb large current to clamp the voltage between the two ends of the TVS diode at a predetermined value, so as to ensure that the following components in the circuit are prevented from the damage caused by the impact of the instantaneous high-speed energy.

The prior scheme generally uses a TVS device as an ESD protection device for protecting the high-speed data transfer interface such as HDMI, USB, DVI and the like. The ESD protection device can be integrated with the protected circuits or be a discrete device separated from the protected circuits during semiconductor fabrication of the device.

FIG. 1 is a schematic circuit diagram of a common ESD protection device in the prior art. As referring to FIG. 1, the ESD protection device includes a Zener diode Dz consisting of a heavily-doped PN junction, a rectifier diode D1 and a rectifier diode D2. The rectifier diode D2 is coupled in parallel to the serial circuit consisting of the Zener diode Dz and the rectifier diode D1 between a first electrode and a second electrode. The anode of the rectifier diode D1 and the cathode of the rectifier diode D2 are coupled to the first electrode and the anode of the Zener diode Dz and the anode of the rectifier diode D2 are coupled to the second electrode.

As referring to FIG. 1, the operating principle of the above-described ESD protection device is as follows. When a positive ESD voltage occurs at the first electrode, the ESD current flows from the rectifier diode D1, the Zener diode Dz to the second electrode, the current path L2 is effective, the rectifier diode D1 is under forward bias, and a reverse breakdown voltage is applied across the Zener diode Dz, so that the voltage of the first electrode is clamped to be a relatively small value; when a negative ESD voltage occurs at the first electrode, the ESD current flows from GND to D2, the current path L1 is effective, the rectifier diode D2 is under forward bias, while the rectifier diode D1 is under reverse bias, the current path L2 is disconnected.

FIG. 2 is an equivalent circuit of the capacitance of the circuit shown by the FIG. 1. It can be obtained from FIG. 2 that the capacitance between the first electrode and GND is obtained by the equivalent circuit of the capacitor in FIG. 2, that is, the parasitic capacitance of the ESD protection device is $C_{I/O\text{-}GND}=C1*CZ/(C1+CZ)+C2$. In order to realize high ESD protection performance, the PN junction which forms the Zener diode Dz need to have a relatively large junction area and a pretty high doping concentration, so that CZ is inevitably large, thus $C_{I/O\text{-}GND}$ is approximately equal to $C1+C2$. The capacitance $C_{I/O\text{-}GND}$ of the ESD protection device can be reduced effectively as long as the capacitance values C1, C2 are appropriately small. Accordingly, obtaining small capacitance values C1, C2 is particularly important for forming the device structure of the circuit shown in FIG. 1.

FIG. 3 is a semiconductor structure diagram in the prior art for realizing the device corresponding to the circuit shown in FIG. 1. An N-type buried layer NBL and a heavily doped P-type substrate P+sub constitute Dz, an N-type epitaxial layer Nepi and a doped region P+ in a P-type epitaxial layer constitute D1, an N-type epitaxial layer N– and the heavily doped P-type substrate P+sub constitute D2.

During the research of the present invention, the inventors find that the prior art has following disadvantages.

In order to decrease the parasitic capacitance of the ESD protection device, the capacitance values C1 and C2 of the rectifier diodes D1 and D2 should be reduced as much as possible. The lower the doping concentration of the PN junction which forms the diode is, the smaller the capacitance of the diode will be. In order to obtain a small capacitance value C2, the doping concentration of the N-type epitaxial layer N– should be very low. However, due to self-doping of the buried layer NBL, the doping concentration of the region (indicated by a dashed box in FIG. 3) where the epitaxial layer N– is close to the heavily doped substrate P+sub will be increased, thus finally make the capacitance value C2 apparently larger than a desired value in the design. As a result, the capacitance of the whole ESD protection device will be increased and cannot meet the ESD protection requirements for high-speed transfer interfaces.

SUMMARY OF THE DISCLOSURE

One objective of the present disclosure is to provide a semiconductor structure of an ESD protection device having low capacitance and a method for manufacturing the same.

According to a first aspect, there is provided a method for manufacturing the semiconductor structure of the ESD protection device, comprising:

forming a buried layer (402) with a first doping type and a buried layer (403) with a second doping type in a first region and a second region on a top surface of a semiconductor substrate (401) with the first doping type, respectively; forming an epitaxial layer (405) with a second doping type on the buried layer (402) with the first doping type and the buried layer (403) with the second doping type, wherein the buried layer (402) with the first doping type and the buried layer (403) with the second doping type are buried between the semiconductor substrate (401) and the epitaxial layer (405), a first doped region (407) with a first doping type is formed on a top of a third region (4051) of the epitaxial layer (405) on the buried layer (403) with the second doping type located.

In connection with the first aspect, in the first implementation mode, due to self-doping of the first type of the buried layer (402), the doping concentration of the fourth region (4052) on the top of the buried layer (402) with the first doping type of the epitaxial layer (405) is lower than that of the third region (4051) of the epitaxial layer (405).

In connection with the first aspect, in the first implementation mode, the method further comprises forming a first metal layer (406), which electrically connects the fourth region (4052) of the epitaxial layer (405) with the first doped region (407) to form a first electrode of the ESD protection device.

In connection with the first aspect, in the first implementation mode, the method further comprises forming a second doped region (408) of a second doping type on a top of the fourth region (4052) of the epitaxial layer (405), wherein the first metal layer (406) electrically connects the first doped region (407) with the second doped region (408).

In connection with the first aspect, in the first implementation mode, the second doped region (408) has a doping concentration greater than that of the epitaxial layer (405).

In connection with the first aspect, in the first implementation mode, the first doped region (407) has a doping concentration greater than that of the epitaxial layer (405).

In connection with the first aspect, in the first implementation mode, the method further comprises forming an isolation structure (409), wherein the isolation structure (409) is located on the top surface of the semiconductor layer (401), separating the buried layer (402) with the first doping type from the buried layer (403) with the second doping type, and separating the ESD protection device from other devices arranged on the semiconductor substrate (401).

In connection with the first aspect, in the first implementation mode, the method further comprises forming a second metal layer on the bottom of the semiconductor substrate (401).

In connection with the first aspect, in the first implementation mode, the doping concentration of the buried layer (402) with the first doping type is relevant to a clamping voltage of the ESD protection device and the doping concentration of the buried layer (403) with the second doping type, the smaller the clamping voltage is, the greater the doping concentration of the buried layer (403) with the second doping type and the doping concentration of the buried layer (402) with the first doping type are.

In connection with the first aspect, in the first implementation mode, a ratio of the doping concentration of the buried layer (402) with the first doping type and the buried layer (403) with the second doping type is within the range of 1/100 to 1/20.

In connection with the first aspect, in the first implementation mode, the doping concentration of the semiconductor substrate (401) is not less than $1e19$ atoms/$Cm^3$.

In connection with the first aspect, in the first implementation mode, the doping concentration of the buried layer (403) with the second doping type is not less than $1e16$ atoms/$cm^3$ and not greater than $1e20$ atoms/$cm^3$.

In connection with the first aspect, in the first implementation mode, the doping concentration of the buried layer (402) with the first doping type is not less than $1e12$ atoms/$cm^3$ and not greater than $1e17$ atoms/$cm^3$.

According to the second aspect, there is provided a semiconductor structure of an ESD protection device, comprising: a semiconductor substrate (401) with a first doping type; a buried layer (402) with a first doping type and a buried layer (403) with a second doping type respectively located on a first region and a second region on a top of the semiconductor substrate (401);

an epitaxial layer (405) located on the semiconductor substrate (401); and a first doped region (407) with a first doping type located on a top of a third region (4051) of the epitaxial layer (405), wherein the buried layer (402) with the first doping type and the buried layer (403) with the second doping type are buried between the semiconductor substrate (401) and the epitaxial layer (405).

In connection with the second aspect, in the first implementation mode, due to self-doping of the first type of buried layer (402), the doping concentration of the fourth region (4052) on the top of the buried layer (402) with the first doping type of the epitaxial layer (405) is lower than that of the third region (4051) in the epitaxial layer (405).

In connection with the second aspect, in the first implementation mode, the semiconductor structure further comprises a first metal layer (406), which electrically connects the fourth region (4052) in the epitaxial layer (405) with the first doped region (407) to form a first electrode of the ESD protection device.

In connection with the second aspect, in the first implementation mode, the semiconductor structure further comprises a second doped region (408) of a second doping type on a top of the fourth region (4052) of the epitaxial layer (405), wherein the first metal layer (406) electrically connects the first doped region (407) with the second doped region (408).

In connection with the second aspect, in the first implementation mode, the second doped region (408) has a doping concentration greater than that of the epitaxial layer (405).

In connection with the second aspect, in the first implementation mode, the first doped region (407) has a doping concentration greater than that of the epitaxial layer (405).

In connection with the second aspect, in the first implementation mode, the semiconductor structure further comprises an isolation structure (409), wherein the isolation structure (409) is located on the top surface of the semiconductor layer (401), separating the buried layer (402) with the first doping type from the buried layer (403) with the second doping type, and separating the ESD protection device from other devices arranged on the semiconductor substrate (401).

In connection with the second aspect, in the first implementation mode, the semiconductor structure further comprises a second metal layer being formed on the bottom of the semiconductor substrate (401).

In connection with the second aspect, in the first implementation mode, the doping concentration of the buried layer (402) with the first doping type is relevant to a clamping voltage of the ESD protection device and the doping concentration of the buried layer (403) with the second doping type, the smaller the clamping voltage is, the greater the doping concentration of the buried layer (403) with the second doping type and the doping concentration of the buried layer (402) with the first doping type are.

In connection with the second aspect, in the first implementation mode, a ratio of the doping concentration of the buried layer (402) with the first doping type and the buried layer (403) with the second doping type is within the range of 1/100 to 1/20.

In connection with the second aspect, in the first implementation mode, the doping concentration of the semiconductor substrate (401) is not less than 1e19 atoms/cm$^3$.

In connection with the second aspect, in the first implementation mode, the doping concentration of the buried layer (403) with the second doping type is not less than 1e16 atoms/cm$^3$ and not greater than 1e20 atoms/cm$^3$.

In connection with the second aspect, in the first implementation mode, the doping concentration of the buried layer (402) with the first doping type is not less than 1e12 atoms/cm$^3$ and not greater than 1e17 atoms/cm$^3$.

From the above, in the embodiments, because the buried layer (402) with the first doping type is formed on the second region of the top surface of the semiconductor substrate (401) with the first doping type, self-doping effect also occurs on the fourth region (4052) of the top of the epitaxial layer (405) with the second doping type in the process of forming the epitaxial layer (405) with the second doping type due to the buried layer (402) with the first doping type, so that the impacts on the parasitic capacitance C2 of the second rectifier diode D2 caused by the self-doping effect of the buried layer (403) with the second doping type can be counteracted, which avoids an increase of the parasitic capacitance C2 and meanwhile reduces the doping concentration of the fourth region (4052) of the epitaxial layer (405) with the second doping type appropriately. The parasitic capacitance of the first rectifier diode D1 is reduced correspondingly. Thus, the technical scheme of the embodiment can be used to obtain an ESD protection device with ultra-low capacitance.

DETAILED DESCRIPTION OF THE DISCLOSURE

The present invention will be described in detail with reference to the appended drawings and specific embodiments as follows. The example embodiments of the present invention and description hereinafter are used for illustrating the invention but not for limiting the invention.

A First Embodiment

Figure 4:
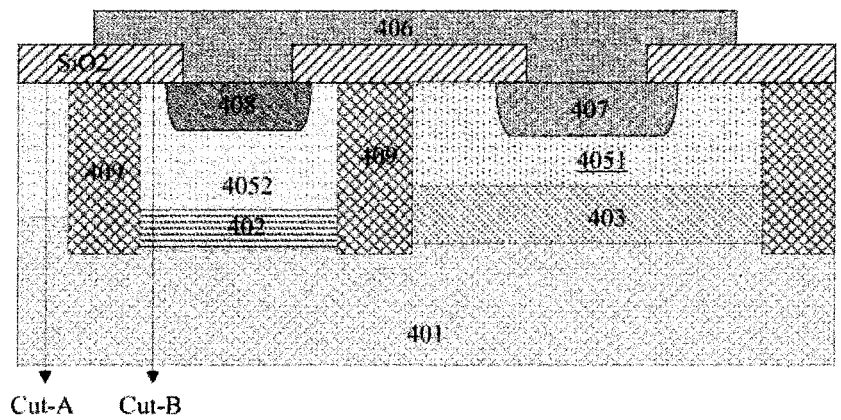
FIG. 4 is a schematic diagram of a semiconductor structure of an ESD protection device provided by a first embodiment of the present disclosure.
Figure 5:
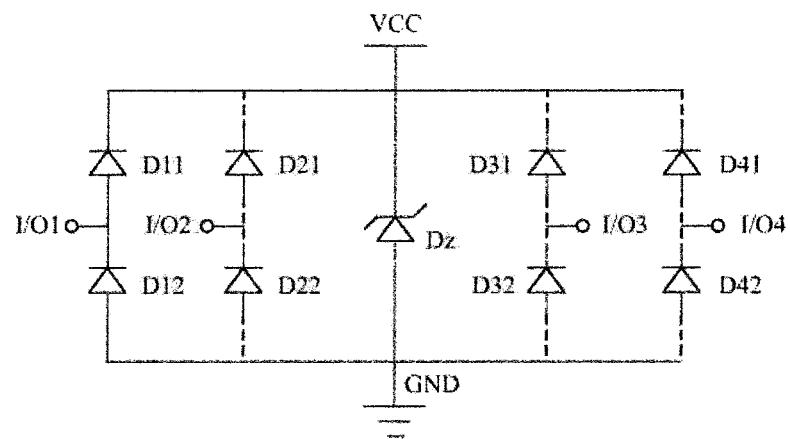
FIG. 5 is a schematic circuit diagram of a multi-channel ESD protection device provided by a first embodiment of the present disclosure.

As referring to FIGS. 4 and 5, the semiconductor structure typically includes a semiconductor substrate 401, a buried layer 402 with a first doping type, a buried layer 403 with a second doping type, an epitaxial layer 405 with the second doping type, a doped region 407 with the first doping type and a first metal layer 406.

The doping type of the semiconductor substrate 401 is referred to as the first doping type. In the embodiment, the doping types include P-type and N-type, the first doping type is one of the P-type and N-type, the second doping type is the other.

The buried layer 402 with the first doping type is located in a first region on a top of the semiconductor substrate 401, the buried layer 403 with the second doping type is located in a second region on the top of the semiconductor substrate 401. The epitaxial layer 405 with the second doping type is located on the buried layer 402 with the first doping type and the buried layer 403 with the second doping type. The buried layer 402 with the first doping type and the buried layer 403 with the second doping type are buried between the semiconductor substrate 401 and the epitaxial layer 405 with the second doping type.

In the process of forming the epitaxial layer 405 with the second doping type, self-doping occurs because the doping concentration of the buried layer 403 with the second doping type is relative high, that is, in the process of forming the epitaxial layer 405 with the second doping type, partial dopant in the buried layer 403 with the second doping type is doped into the epitaxial layer 405 with the second doping type. As a result, the region (referred to as a third region 4051) above the buried layer 403 with the second doping type has a doping concentration greater than a predetermined doping concentration of the epitaxial layer 405 with the second doping type (i.e., the doping concentration of the epitaxial layer 405 with the second doping type in the case of the buried layer 403 is not self-doped with the second doping type). In addition, if the buried layer 402 with the first doping type doesn't exist, the region (referred to as a fourth region 4052) located in the epitaxial layer 405 with the second doping type and on the buried layer 402 with the first doping type has a doping concentration greater than the predetermined doping concentration due to self-doping of the buried layer 403 with the second doping type. Although the influence on the fourth region 4052 due to self-doping of the buried layer 403 with the second doping type is lighter than that on the third region 4051, it will still make the capacitance of the ESD protection device greater than a predesigned value.

In the ESD protection device provided by the embodiment, the buried layer 402 with the first doping type is located below the fourth region 4052 of the epitaxial layer 405 with the second doping type. Because the buried layer 402 with the first doping type has a high doping concentration, self-doping also occurs in the process of forming the epitaxial layer 405 with the second doping type, that is, in the process of forming the epitaxial layer 405 with the second doping type, partial dopant in the buried layer 402 with the first doping type is doped into the epitaxial layer 405 with the second doping type. The self-doping effect of the buried layer 402 with the first doping type can counteract the self-doping effect caused by the buried layer 403 with the second doping type to the epitaxial layer 405 with the second doping type, so that the capacitance value of the ESD protection device according to the disclosure is ensured to be the predesigned value.

In the disclosure, the doping concentration of the buried layer 402 with the first doping type is required to be determined in accordance with the doping concentration of the buried layer 403 with the second doping type. If the doping concentration of the buried layer 403 with the second doping type increases, the doping concentration of the buried layer 402 with the first doping type is also required to increase, otherwise, the self-doping effect of the buried layer 402 with the first doping type cannot completely counteract the influence of the self-doping effect caused by the buried layer 403 with the second doping type to the epitaxial layer 405 with the second doping type. However, the doping concentration of the buried layer 402 with the first doping type cannot be too high, either, otherwise, the epitaxial layer 405 with the second doping type will be inverted into an epitaxial layer with a first doping type, resulting in a large-size interface and high parasitic capacitance of the device.

The doped region 407 with the first doping type is located on the top surface of the third region 4051 of the epitaxial layer 405 with the second doping type, that is, on the buried layer 403 with the second doping type.

The first metal layer 406 may be located on the epitaxial layer 405 with the second doping type, the first metal layer 406 electrically connects the first doped region 407 with the first doping type and the fourth region 4052 of the epitaxial layer 405 with the second doping type together, to form a first electrode of the ESD protection device.

Figure 1:
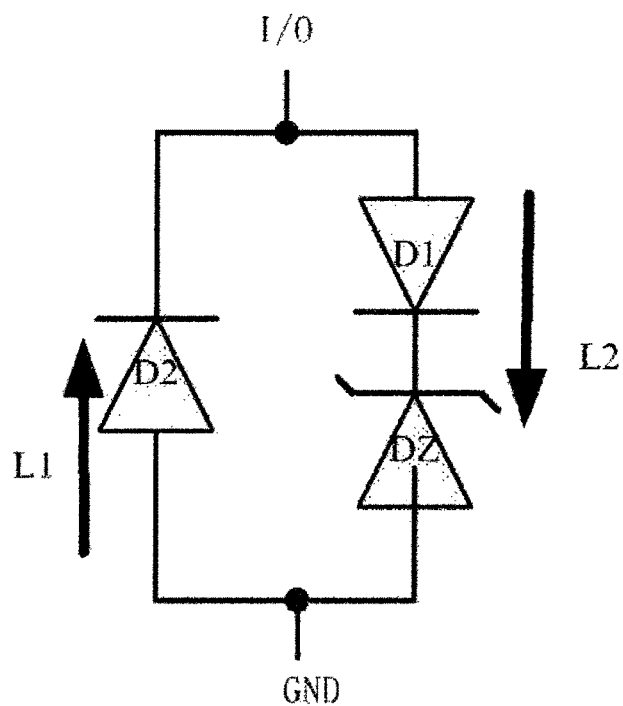
FIG. 1 is a schematic circuit diagram of a common ESD protection device in the prior art.
Figure 2:
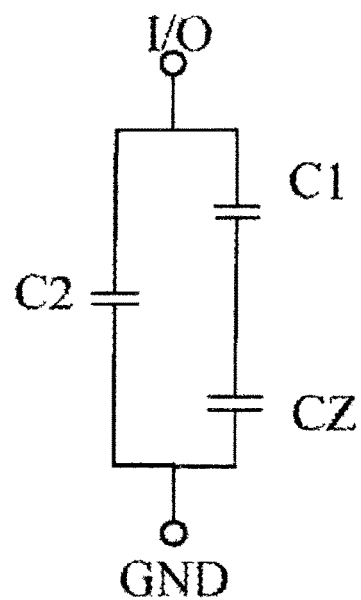
FIG. 2 is an equivalent circuit of the capacitance of the circuit shown in FIG. 1.
Figure 3:
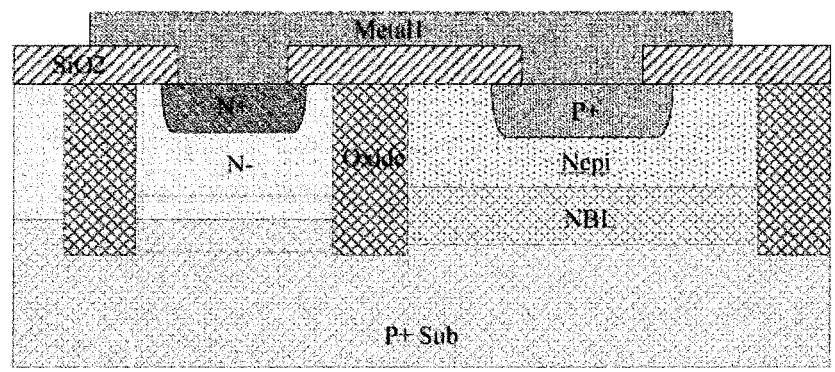
FIG. 3 is a schematic diagram of a semiconductor structure of the device corresponding to the circuit shown in FIG. 1.

In the semiconductor structure shown in FIG. 4, the buried layer 403 with the second doping type and the semiconductor substrate 401 with the first doping type constitute a Zener diode Dz, the first doped region 407 with the first doping type and the third region 4051 of the epitaxial layer 405 with the second doping type constitute a first rectifier diode D1, the Zener diode Dz and the first rectifier diode D1 are coupled in series, the fourth region 4052 of the epitaxial layer 405 with the second doping type and the buried layer 402 with the first doping type constitute a second rectifier diode D2, and the first metal layer 406 electrically couples the serial circuit of the Zener diode Dz and the first rectifier diode D1 to the second rectifier diode D2 in parallel. In the embodiment, if the first doping type is P-type and the second doping type is N-type, the semiconductor structure shown in FIG. 4 is equivalent to the circuit shown in FIG. 1, where the first metal layer 406 can be the first electrode of the ESD protection device shown in FIG. 1. Moreover, a second metal layer (not shown) can be further arranged on the back surface of the semiconductor substrate 401 with the first doping type, serving as a second electrode of the ESD protection device, the second electrode (for example, it usually used as the ground terminal GND).

From the above, in the embodiment, because the buried layer 402 with the first doping type is formed in the first region at the top surface of the semiconductor substrate 401 with the first doping type, self-doping effect can also be caused by the buried layer 402 with the first doping type to the fourth region 4052 of the epitaxial layer 405 with the second doping type in the process of forming the epitaxial layer 405 with the second doping type, so that the impacts on the parasitic capacitance C2 of the second rectifier diode D2 caused by the self-doping effect which is caused by the buried layer 403 with the second doping type to the epitaxial layer 405 with the second doping type can be counteracted, which avoids an increase of the parasitic capacitance C2 and meanwhile reduces the doping concentration of the fourth region 4052 of the epitaxial layer 405 with the second doping type appropriately. The parasitic capacitance of the first rectifier diode D1 is reduced correspondingly. Thus, the technical scheme of the embodiment can be used to obtain an ESD protection device with ultra-low capacitance.

As an example of the embodiment, it is preferred but not limited that the doping concentration of the first doped region 407 is greater than that of the third region 4051 of the epitaxial layer 405 with the second doping type and then the first doped region 407 is used as an ohmic contact region of the first rectifier diode D1. The scheme is helpful to reduce the contact resistance of the ESD protection device.

As an example of the embodiment, the second doped region 408 with the second doping type may be formed on the top of the fourth region 4052 of the epitaxial layer 405 with the second doping type, so as to make the doping concentration of the second doped region 408 greater than that of the fourth region 4052 of the epitaxial layer 405 with the second doping type, therefore the second doped region 408 functions as an ohmic contact region of the second rectifier diode D2. Under this condition, the first metal layer 406 can be formed on the top of the first doped region 407 and the second doped region 408, to electrically connect both of them and thus the first metal layer 406 constitutes the first electrode of the ESD protection device. The scheme is helpful to reduce the contact resistance of the ESD protection device.

As an example of the embodiment, the doping concentration of the buried layer 402 with the first doping type is determined in accordance with the doping concentration of the buried layer 403 with the second doping type and the doping concentration of the epitaxial layer 405 with the second doping type, so that the doping concentration of the buried layer 402 with the first doping type can counteract the influence of the self-doping effect caused by the buried layer 403 with the second doping type to the epitaxial layer 405 with the second doping type on the parasitic capacitance C2 of the second rectifier diode D2, and the third region 4051 of the epitaxial layer 405 with the second doping type cannot be inverted to the first doping type due to the self-doping effect caused by the buried layer 402 with the first doping type to the epitaxial layer 405 with the second doping type. The junction area of the second rectifier diode D2 is thus decreased, which will decrease the capacitance value of the parasitic capacitor C2.

As a preferred embodiment, the doping concentration of the buried layer 403 with the second doping type can be determined in accordance with the clamping voltage of the ESD protection device. The larger the clamping voltage of the ESD protection device is, the lower the doping concentration of the buried layer 403 with the second doping type and the doping concentration of the buried layer 402 with the first doping type are. Otherwise, the smaller the clamping voltage is, the higher the doping concentration of the buried layer 403 with the second doping type and the buried layer 402 with the first doping type are.

In the research of the present invention, the inventor finds that the doping concentration of the buried layer 402 with the first doping type should be lower than that of the buried layer 403 with the second doping type. When the ratio of them is within the range of 1/100 to 1/20, it is ensured that the ESD protection device according to the embodiment will have an ultra-low parasitic capacitance.

Moreover, because the buried layer 403 with the second doping type and the semiconductor substrate 401 with the first doping type constitute a PN junction of the Zener diode Dz, the breakdown voltage of the Zener diode Dz can be defined within the range of 2V to 48V or a wider range by appropriately adjusting the doping concentration of the buried layer 403 with the second doping type and the semiconductor substrate 401. Therefore, the ESD protection device according to the disclosure can be adapted to various voltage sources with a wide voltage range.

As an example of the embodiment, in order to reduce the resistance of the semiconductor substrate 401, it is preferred to use a heavily doped semiconductor substrate 401. Typically, the maximum doping concentration of the semiconductor substrate 401 is not less than 1e19 atoms/cm$^3$.

As an example of the embodiment, the maximum doping concentration of the buried layer 402 with the first doping type is typically 1e12~101e17 atoms/cm$^3$.

As an example of the embodiment, the maximum doping concentration of the buried layer 403 with the second doping type is typically 1e16~1e20 atoms/cm$^3$.

As an example of the embodiment, an isolation structure 409 is further arranged in the semiconductor structure according to the embodiment. The isolation structure 409 is formed on the top surface of the semiconductor substrate 401 and across the epitaxial layer 405 with the second doping type. The isolation structure 409 includes all internal isolation structures inside the ESD protection device and external isolation structures. The internal isolation structure (shown as the intermediate part in FIG. 4) are spaced between the buried layer 402 with the first doping type and the buried layer 403 with the second doping type, which is helpful to reduce the junction area of the ESD protection device and decrease the parasitic capacitance. The external isolation structures (shown as the part on both sides in FIG. 4) are spaced between the ESD protection device and other devices on the semiconductor substrate 401, which can prevent the ESD protection device from the influence cause by other devices.

As an example of the embodiment, the isolation structure 409 can be of any conventional structure, for example, includes but not limited to a diffusion isolation or a trench isolation structure.

As an example of the embodiment, a second metal layer is also arranged on the bottom of the semiconductor substrate 401, and functions as a metal electrode to be referred as a second electrode of the ESD protection device.

Moreover, it should be noted that FIG. 4 only shows a semiconductor structure of a single channel ESD protection device, and for the multi-channel ESD protection device shown in FIG. 5, a number of units having the same structure in FIG. 4 can be manufactured on the semiconductor substrate 401 in accordance with the principle of the embodiment.

As referring to FIG. 5, the ESD protection device implements the ESD protection for the ports I/O$_1$ to I/O$_n$, so the second electrode can or cannot be led out, that is, either the second metal layer can be arranged on the semiconductor substrate 401 and serves as the metal electrode of the second electrode, or the metal electrode can be omitted (i.e., there's no need to arrange the second metal layer on the semiconductor substrate 401), all these depends on the customers' requirements.

A Second Embodiment

Figure 6:
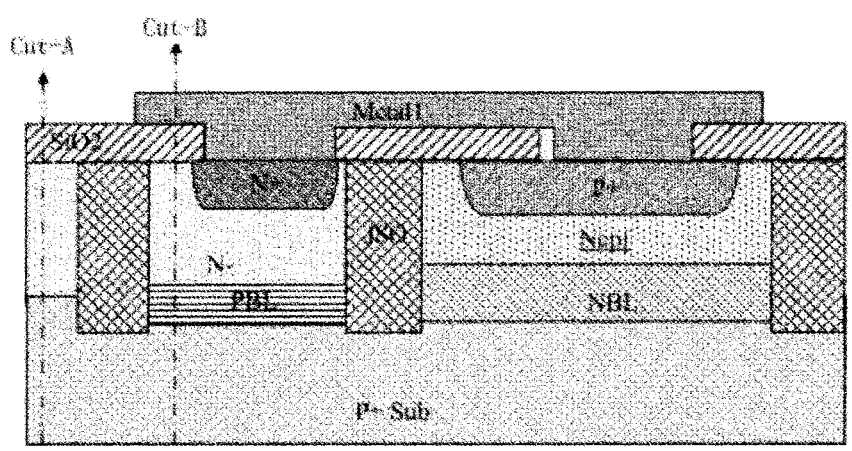
FIG. 6 is a schematic diagram of a semiconductor structure of an ESD protection device according to a second embodiment of the present disclosure.

FIG. 6 is a schematic diagram of a semiconductor structure of an ESD protection device according to a second embodiment of the disclosure. In the embodiment, the first doping type is P-type, the second doping type is N-type.

According to the embodiment, the semiconductor structure uses a P-type semiconductor substrate 401 with relatively high doping concentration (referred to as P+Sub), and the P-type buried layer PBL, i.e., the buried layer 402 with the first doping type, and an N-type buried layer NBL, i.e., the buried layer 403 with the second doping type are formed on P+Sub, respectively, an N-type epitaxial layer is formed on PBL and NBL, PBL and NBL are buried between the N-type epitaxial layer and P+Sub. Due to the self-doping effect of the NBL and PBL below the N-type epitaxial layer, the two regions of the N-type epitaxial layer (i.e., the third region 4051, the fourth region 4052) which are located on the NBL and PBL have different doping concentration. For discrimination, in the N-type epitaxial layer, the region located on the NBL is referred to as Nepi, the region located on the PBL is referred to as N−. A P+type doped region with relatively high doping concentration (denoted as P+, i.e., the first doped region 407 with the first doping type) is formed on the Nepi and an N+type doped region with relatively high doping concentration (denoted as N+, i.e., the second doped region 408 with the second doping type) is formed on the N−.

In this way, the NBL and P+Sub constitute Dz, the P+ and Nepi constitute D1, the N− and PBL constitute D2, the first metal layer 406 respectively on the N+ and P+ is denoted as Metal1, the Metal1 electrically connects the N+ and P+, serves as the first electrode of the ESD protection device, the second metal layer (not denoted in FIG. 6) electrically connects the P+Sub, serves as the second electrode of the ESD protection device.

As an example of the embodiment, the N-type epitaxial layer has a low doping concentration, and the doping concentration of the NBL is slightly lower than the doping concentration of the P+Sub.

The parameters and the structural arrangement of the respective semiconductor layers in the ESD protection device of the present embodiment can refer to the detail in the corresponding description in the first embodiment.

The embodiment provides a detailed implementation mode of the first embodiment shown in FIG. 4, but not limited thereto.

A Third Embodiment

Figure 7:
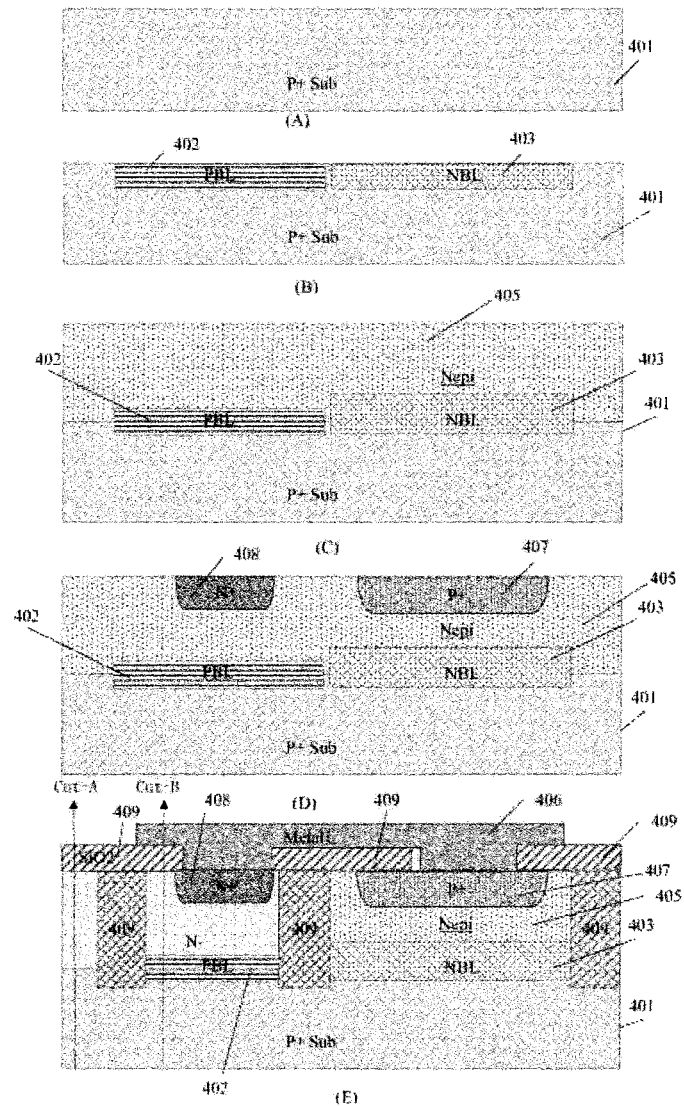
FIG. 7 shows the cross-sectional diagrams of a semiconductor structure in various steps of a process for manufacturing the semiconductor structure of the ESD protection device in FIG. 4 according to a third embodiment of the present disclosure.

FIG. 7 shows the cross-sectional diagrams of a semiconductor structure in various steps of a process for manufacturing the semiconductor structure of the ESD protection device in FIG. 4. As referring to FIG. 7, the process includes the following steps.

At step 701, as shown in FIG. 7A, the semiconductor substrate 401 with the first doping type is provided, which may be but not limited to the P+Sub in FIG. 6.

The specific parameters may refer to the description in the first and second embodiments, but is not limited thereto.

At step 702, as shown in FIG. 7B, the buried layer 402 with the first doping type and the buried layer 403 with the second doping type are respectively manufactured in the first region and the second region of the semiconductor substrate 401, the manufacture sequence is not limited.

In research of the present embodiment, the inventor finds that if the semiconductor substrate 401 has a high doping concentration, it is sometimes difficult to directly form the buried layer 402 with the first doping type and the buried layer 403 with the second doping type on the semiconductor substrate 401. Thus, before the buried layer 402 with the first doping type and the buried layer 403 with the second doping type are manufactured, the epitaxial layer with the second doping type (not shown in FIG. 4B) can be formed on the surface of the semiconductor substrate 401 on basis of design requirements and then the buried layer 402 with the first doping type and the buried layer 403 with the second doping type are manufactured in the first region and the second region.

The doping concentrations of the buried layer 402 with the first doping type and the buried layer 403 with the second doping type can be determined with reference to the description of the first and second embodiments, but they are not limited thereto.

At step 703, as shown in FIG. 7C, the epitaxial layer 405 with the second doping type is formed on the structure in FIG. 7B.

In the embodiment, the doping concentration of the epitaxial layer 405 with the second doping type is very low typically. The specific further structural arrangement and parameters can refer to the description in the first and second embodiments.

At step 704, as shown in FIG. 7D, the first doped region 407 with the first doping type is formed on the epitaxial layer 405 with the second doping type located on the buried layer 403 with the second doping type. Because the first doped region 407 will be used as an ohmic contact region afterwards, the doping concentration of the first doped region 407 is set to be very high.

Preferably, the second doped region 408 with the second doping type can be formed on the first epitaxial layer 405 on the buried layer 402 with the first doping type. Because the second doped region 408 will be used as an ohmic contact region, the doping concentration of the second doped region 408 is set to be very high.

Moreover, the epitaxial layer 405 with the second doping type and the buried layer 402 with the first doping type constitute the second rectifier diode D2, the second doped region 408 is the ohmic contact region of the second rectifier diode D2, the first doped region 407 and the first epitaxial layer 405 on the buried layer 403 with the second doping type constitute the first rectifier diode D1, the first doped region 407 is used as the ohmic contact region of the first rectifier diode D1.

At step 705, as shown in FIG. 7E, the first metal layer Metal1 (or 406) is formed and electrically connect the rectifier diodes D1 and D2, Metal1 is used as a first electrode of the ESD protection device, and the first electrode is used for I/O when the first doping type is P-type.

Moreover, a second metal electrode (not shown) may be formed on the back surface of the semiconductor substrate 401, and the second metal electrode may be a second electrode when the first doping type is P-type.

When the first electrode is an I/O terminal of the ESD protection device, the second electrode is a ground terminal of the ESD protection device.

It should be noted that an interlayer dielectric layer 410 such as $SiO_2$ layer is required to be manufactured before the fabrication of the metal electrode.

Moreover, as shown in FIG. 4, in order to reduce the size of the ESD protection device and further decrease the capacitance of the ESD protection device, the isolation structure 409 is required to be manufactured inside the ESD protection device and between the ESD protection device and other devices, such as a diffusion structure or a trench isolation structure. The manufacture sequence to form the isolation structure 409 is not limited, the process of the isolation structure can be performed before or after any step of the process for manufacturing the semiconductor structure of the ESD protection device, the specific process for manufacturing the isolation structure 409 can refer to prior art.

Figure 8:
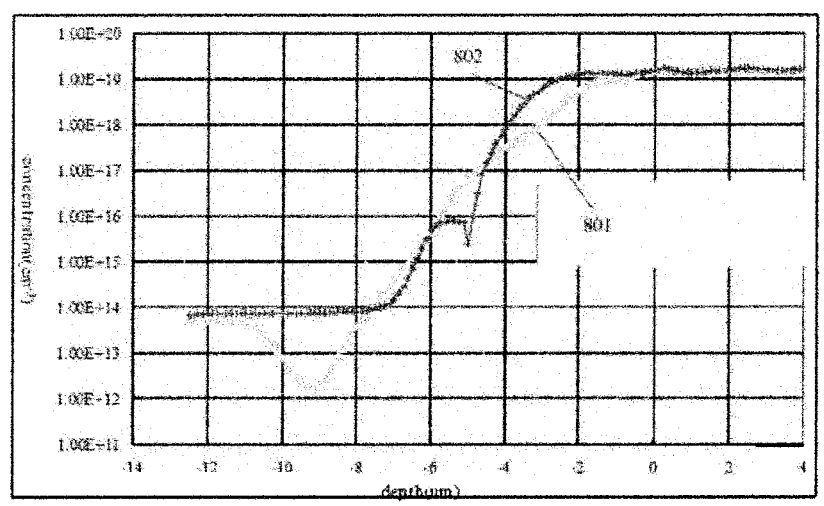
FIG. 8 is curved diagram of an extended capacitance provided by the third embodiment.

In order to further describe the beneficial effects of the present disclosure, an extended resistance test is performed on the semiconductor structure in FIG. 7, and the extended resistance curved lines 801 and 802 are acquired, as shown in FIG. 8.

The extended resistance curved line 801 corresponds to the sampling test area indicated by the line Cut-A in FIG. 7. As referring to FIGS. 7 and 8, the extended resistance curved line 801 corresponds to the regions P+Sub and N− indicated by the line Cut-A in FIG. 7 from left to right, the extended resistance curved line 802 corresponds to the regions P+Sub, PBL and N− indicated by the line Cut-A in FIG. 7 from left to right.

It can be found by comparing the curved lines 801 and 802 that the doping concentration of the region N− is decreased due to the anti-doping effect of the PBL layer on the region N−. Obviously, the PBL is arranged in the embodiment to achieve significant anti-doping effect.

The preferred embodiments of the present invention are described in the above paragraphs, but not construed as limiting the present invention. Many modifications, equivalence, variations of the preferred embodiments can be made without departing from the doctrine and spirit of the present invention.

The invention claimed is:

1. A method for manufacturing a semiconductor structure of an ESD protection device, comprising:
   forming a buried layer with a first doping type and a buried layer with a second doping type in a first region and a second region on a top surface of a semiconductor substrate with said first doping type, respectively;
   forming an epitaxial layer with said second doping type on said buried layer with said first doping type and said buried layer with said second doping type,
   wherein said buried layer with said first doping type and said buried layer with said second doping type are buried between said semiconductor substrate and said epitaxial layer, a first doped region with said first doping type is formed on a top of a third region of said epitaxial layer which is on said buried layer with said second doping type.

2. The method according to claim 1, wherein due to self-doping of said buried layer with said first doping type, a fourth region, which is located on a top of said buried layer with said first doping type in said epitaxial layer, has a doping concentration lower than that of said third region in said epitaxial layer.

3. The method according to claim 1, further comprising:
   forming a first metal layer which electrically connects said fourth region of said epitaxial layer with said first doped region to form a first electrode of said ESD protection device.

4. The method according to claim 1, further comprising:
   forming a second doped region with said second doping type on a top of said fourth region of said epitaxial layer, wherein said first metal layer electrically connects said first doped region with said second doped region.

5. The method according to claim 4, wherein said second doped region has a doping concentration greater than that of said epitaxial layer.

6. The method according to claim 1, wherein said first doped region has a doping concentration greater than that of said epitaxial layer.

7. The method according to claim 1, further comprising: forming an isolation structure,
wherein said isolation structure is located on said top surface of said semiconductor substrate, separating said buried layer with said first doping type from said buried layer with said second doping type, and separating said ESD protection device and other devices arranged on said semiconductor substrate.

8. The method according to claim 1, further comprising: forming a second metal layer on a bottom of said semiconductor substrate.

9. The method according to claim 1, wherein said doping concentration of said buried layer with said first doping type is relevant to a clamping voltage of said ESD protection device and said doping concentration of said buried layer with said second doping type, the smaller said clamping voltage is, the greater said doping concentration of said buried layer with said second doping type and said doping concentration of said buried layer with said first doping type are.

10. The method according to claim 1, wherein a ratio of said doping concentration of said buried layer with said first doping type and said doping concentration of said buried layer with said second doping type is within a range of 1/100 to 1/20.

11. The method according to claim 1, wherein said doping concentration of said semiconductor substrate is not less than 1e19 atoms/cm$^3$.

12. The method according to claim 1, wherein said doping concentration of said buried layer with said second doping type is not less than 1e12 atoms/cm$^3$ and not greater than 1e20 atoms/cm$^3$.

13. The method according to claim 1, wherein said doping concentration of said buried layer with said first doping type is not less than 1e12 atoms/cm$^3$, and not greater than 1e17 atoms/cm$^3$.

14. A semiconductor structure of an ESD protection device, comprising:
a semiconductor substrate with a first doping type;
a buried layer with said first doping type and a buried layer with a second doping type respectively located in a first region and a second region on a top of said semiconductor substrate;
an epitaxial layer located on said semiconductor substrate; and
a first doped region with said first doping type located on a top of a third region of said epitaxial layer,
wherein said buried layer with said first doping type and said buried layer with said second doping type are buried between said semiconductor substrate and said epitaxial layer.

15. The semiconductor structure according to claim 14, wherein due to self-doping of said buried layer with said first doping type, a fourth region located on a top of said buried layer with said first doping type has a doping concentration lower than that of said third region of said epitaxial layer.

16. The semiconductor structure according to claim 14, further comprising:
a first metal layer which electrically connects said fourth region of said epitaxial layer with said first doped region to form a first electrode of said ESD protection device.

17. The semiconductor structure according to claim 14, further comprising:
a second doped region with said second doping type being formed on a top of said fourth region of said epitaxial layer, wherein said first metal layer electrically connects said first doped region with said second doped region.

18. The semiconductor structure according to claim 17, wherein said second doped region has a doping concentration greater than that of said epitaxial layer.

19. The semiconductor structure according to claim 14, wherein said first doped region has a doping concentration greater than that of said epitaxial layer.

20. The semiconductor structure according to claim 14, further comprising:
an isolation structure, located on a top surface of said semiconductor substrate, separating said buried layer with said first doping type from said buried layer with said second doping type, and separating said ESD protection device from other devices arranged on said semiconductor substrate.

21. The semiconductor structure according to claim 14, further comprising: a second metal layer being formed on a bottom of said semiconductor substrate.

22. The semiconductor structure according to claim 14, wherein said doping concentration of said buried layer with said first doping type is relevant to a clamping voltage of said ESD protection device and said doping concentration of said buried layer with said second doping type, the smaller said clamping voltage is, the greater said doping concentration of said buried layer with said second doping type and said doping concentration of said buried layer with said first doping type are.

23. The semiconductor structure according to claim 14, wherein a ratio of said doping concentration of said buried layer with said first doping type and said doping concentration of said buried layer with said second doping type is within a range of 1/100 to 1/20.

24. The semiconductor structure according to claim 14, wherein said doping concentration of said semiconductor substrate is not less than 1e19 atoms/cm$^3$.

25. The semiconductor structure according to claim 14, wherein said doping concentration of said buried layer with said second doping type is not less than 1e16 atoms/cm$^3$ and not greater than 1e20 atoms/cm$^3$.

26. The semiconductor structure according to claim 14, wherein said doping concentration of said buried layer with said first doping type is not less than 1e16 atoms/cm$^3$.

* * * * *